United States Patent
Liu et al.

(10) Patent No.: US 9,391,056 B2
(45) Date of Patent: Jul. 12, 2016

(54) MASK OPTIMIZATION FOR MULTI-LAYER CONTACTS

(71) Applicant: Taiwan Semiconductor Manufacturing Company, Ltd., Hsin-Chu (TW)

(72) Inventors: Ru-Gun Liu, Zhubei (TW); Tung-Heng Hsieh, Zhudong Town (TW); Tsung-Chieh Tsai, Chu-Bei (TW); Juing-Yi Wu, Hsinchu (TW); Liang-Yao Lee, Taoyuan (TW); Jyh-Kang Ting, Baoshan Township (TW); Chun-Yi Lee, Beipu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 153 days.

(21) Appl. No.: 13/968,992

(22) Filed: Aug. 16, 2013

(65) Prior Publication Data

US 2015/0048457 A1    Feb. 19, 2015

(51) Int. Cl.
*G06F 17/50* (2006.01)
*H01L 27/02* (2006.01)
*H01L 21/8238* (2006.01)
*H01L 21/768* (2006.01)

(52) U.S. Cl.
CPC ........ *H01L 27/0207* (2013.01); *G06F 17/5072* (2013.01); *G06F 17/5081* (2013.01); *H01L 21/823871* (2013.01); *H01L 2924/0002* (2013.01)

(58) Field of Classification Search
CPC . G06F 17/50; G06F 17/5068; G06F 17/5072; G06F 17/5077; G06F 17/5081; H01L 21/76877; H01L 21/823871; H01L 23/481; H01L 27/0207; H01L 27/092; H01L 2924/00; H01L 2924/0002
USPC ........................................ 430/30; 716/50–56
See application file for complete search history.

(56) References Cited

U.S. PATENT DOCUMENTS

| 7,821,039 B2 | 10/2010 | Tien et al. | |
| 2010/0291770 A1* | 11/2010 | Warrick | H01L 21/31144 438/694 |
| 2012/0135600 A1* | 5/2012 | Lin | G06F 17/5072 438/667 |

* cited by examiner

*Primary Examiner* — Eric Ward
(74) *Attorney, Agent, or Firm* — Haynes and Boone, LLP

(57) ABSTRACT

A method for mask optimization, the method including moving any features of a gate contact mask that are in violation of a spacing rule to a second layer contact mask, splitting an elongated feature of the second layer mask that is too close to a feature moved to the second layer mask from the gate contact mask, and connecting two split features of a first layer contact mask, the split features corresponding to the elongated feature of the second layer mask.

20 Claims, 8 Drawing Sheets

MASK OPTIMIZATION FOR MULTI-LAYER CONTACTS

BACKGROUND

Electronic devices include circuitry formed within semiconductor substrates. This circuitry includes a variety of components, including transistors. Such circuitry also includes metal lines and contacts that connect the components in the desired manner in order to form a functional circuit. Fabrication of such circuitry is often done layer upon layer.

For example, a semiconductor substrate may include a number of gate terminals for transistors. The regions of the substrate adjacent to the gate terminals are then doped to form source and drain terminals for a complete transistor. The gate terminals are then surrounded by an interlayer dielectric layer. Holes are then formed through the interlayer dielectric layer extending down to the gate device as well as the doped regions of the substrate. These holes are then filled with a metal material that forms contacts to the gate devices and doped regions. These contacts allow for electrical connection to other layers of circuitry.

In some cases, the contacts that connect through the interlayer dielectric layer to the doped regions of the substrate are formed in two layers while the contacts that connect to the gate devices are formed with only one layer. The holes for both layers of the contacts to the doped regions and the holes for the one layer of contacts to the gate devices are formed using separate masks, for a total of at least three masks. It is desirable to optimize the placement of features on these masks, particularly in cases where the circuitry is relatively congested.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1A:
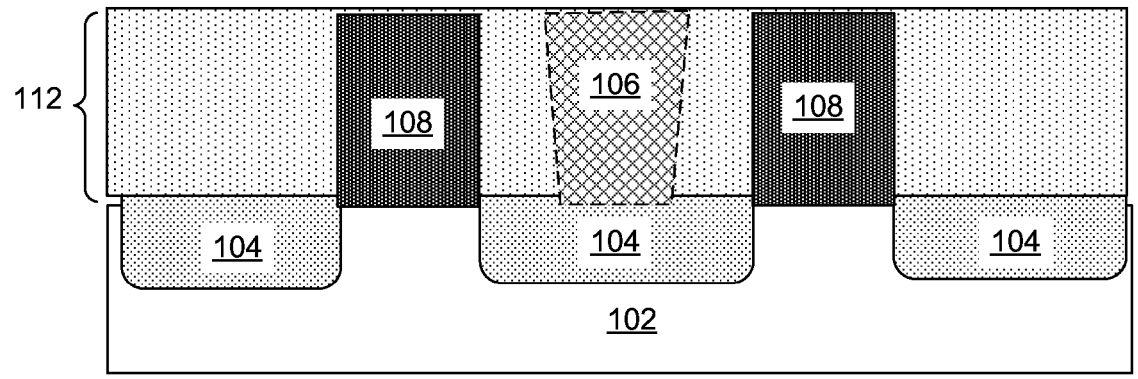
FIGS. 1A-1B are diagrams showing an illustrative process for forming multilayer contacts, according to one example of principles described herein.
Figure 1B:
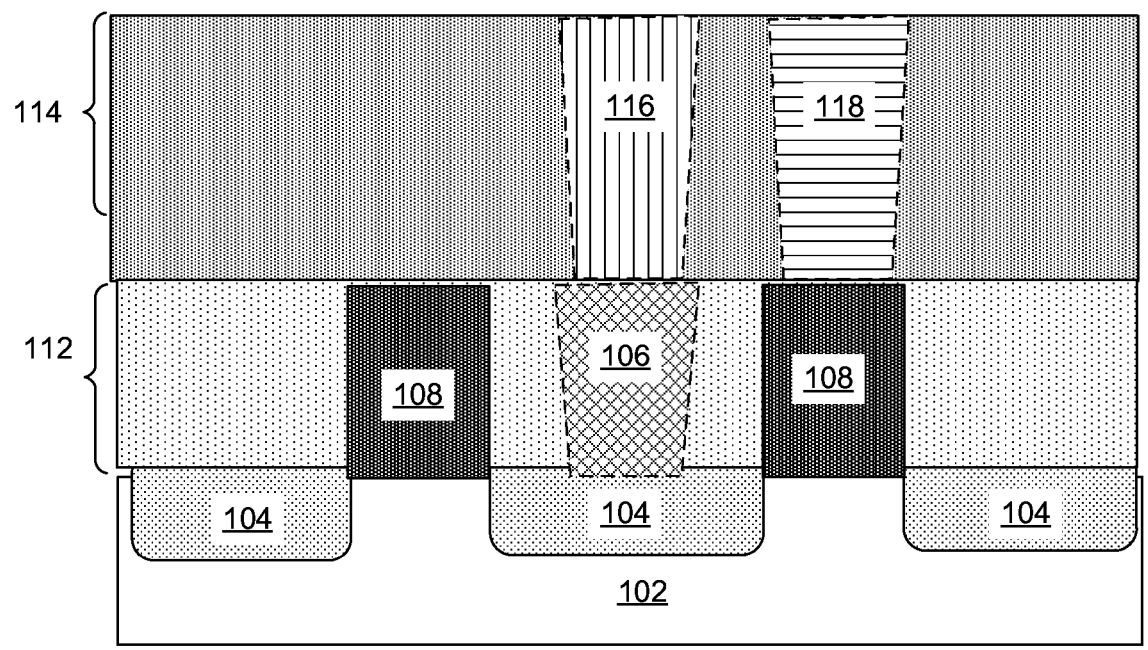

FIGS. 1A-1B are diagrams showing an illustrative process for forming multilayer contacts. According to the present example, FIG. 1A includes a substrate 102 and a number of gate devices 108. Doped regions 104 are formed into the substrate 102 adjacent to the gate devices 108. The doped regions 104 can serve as source or drain regions.

An interlayer dielectric layer 112 is formed over the gate devices 108, thus surrounding them. To create the contacts that will connect to the doped regions 104, holes are formed into the interlayer dielectric layer 112. These holes may be formed through standard semiconductor fabrication processes such as etching. A mask is used to form the pattern for these holes. For purposes of illustration, this mask will be referred to as the first layer contact mask. After the holes are formed, they are filled with an electrically conductive material such as a metal and can thus serve as contacts 106. For purposes of illustration, these contacts 106 will be referred to as the first layer doped region contacts 106. A planarizing process such as a Chemical-Mechanical Polishing (CMP) process can be used to smooth out the surface and remove any excess metal material deposited into the holes.

FIG. 1B illustrates the formation of a second interlayer dielectric layer 114. To complete the contacts that will connect through the interlayer dielectric layers 112, 114 to the doped regions 104, a first set of holes is formed above the first layer doped region contacts 106 formed into the first dielectric layer 112. The mask used to form these holes may be referred to as the second layer mask. These holes are used to form the second layer doped region contacts 116.

In addition to forming the holes for the second layer of the doped region contacts 116, a second set of holes for the contacts that connect to the gate devices 108 is also formed. A separate mask is used to form the second set of holes in the second interlayer dielectric layer 114. This mask will be referred to as the gate contact mask. This second set of holes is used to form the gate contacts 118.

After both sets of holes have been formed, a metal material is deposited into the holes to form the second layer doped region contacts 116 as well as the gate contacts 118. Another CMP process may then be performed to smooth out the surface and remove any excess metal material deposited into the holes. This completes the contacts that connect to the doped regions 104. These completed contacts, which include the first layer doped region contacts 106 and the second layer doped region contacts 116, will be referred to as the full doped region contacts.

The pattern used to form the second layer of the doped contacts 116 is not necessarily the same pattern used to form the first layer of the doped contacts 106. In some cases, the doped region contacts of either layer may also serve as electrical connections between multiple doped regions 104. Likewise, the gate contacts 118 may serve as electrical connections between multiple gate devices 108 or a gate device 108 and a doped region 104.

Figure 2A:
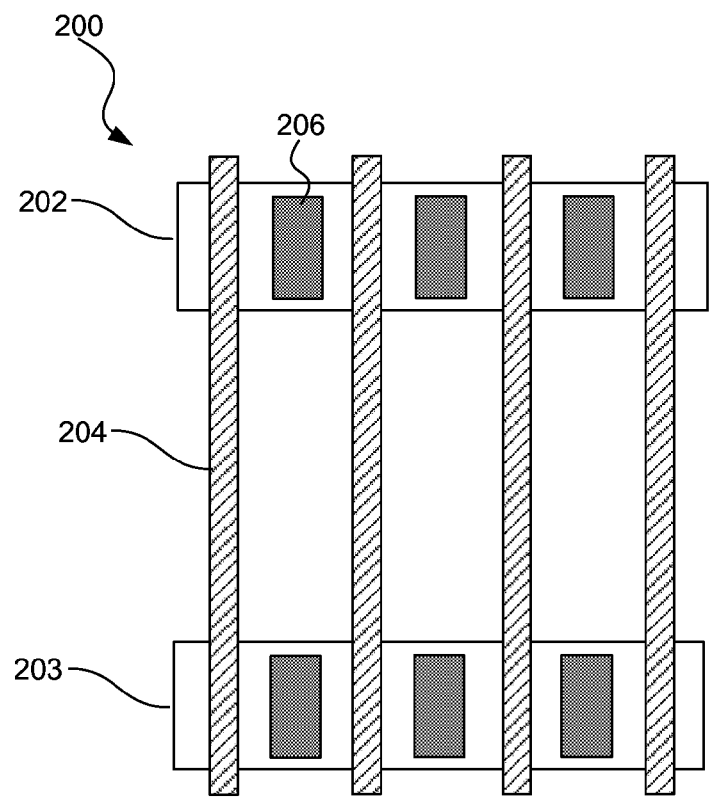
FIGS. 2A-2B are diagrams showing an illustrative top view of multilayer contacts, according to one example of principles described herein.
Figure 2B:
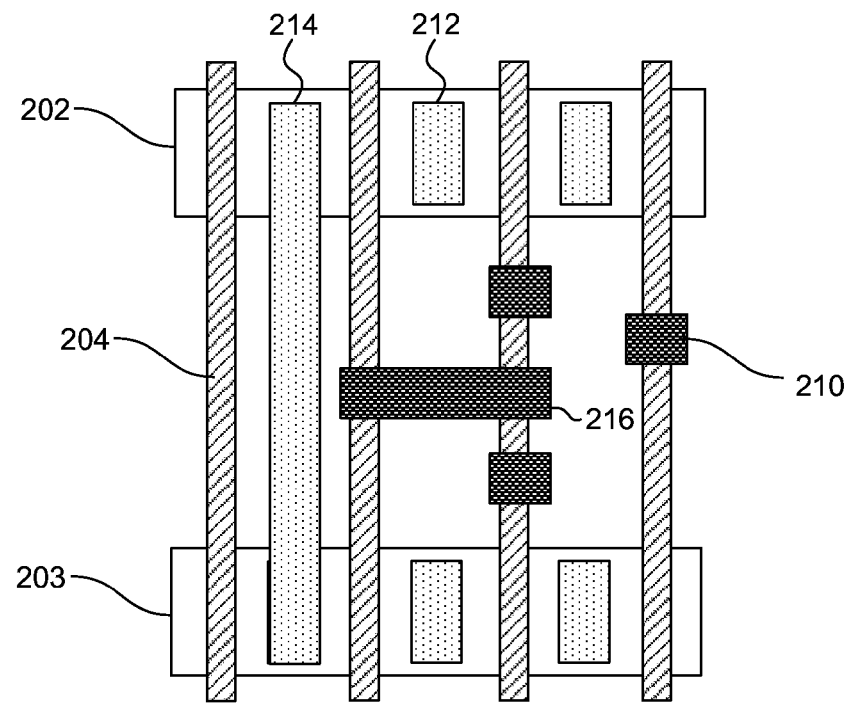

FIGS. 2A-2B are diagrams showing an illustrative top view of multilayer contacts within a circuit device 200. FIG. 2A is a top view of the first layer. As illustrated, a number of elongated gate devices 204 are formed onto a substrate. Doped regions 202, 203 are formed adjacent to the gate devices 204. For example, a source region may be formed on one side of an elongated gate device 204 and a drain region may be formed at the same location on the opposite side of the elongated gate device 204. In one example, one elongated doped region 202 may be used to form a set of p-type transistors. The other doped region 203 may be used to form a set of n-type transistors.

In this example, the gate devices are formed as gate lines. A single gate line may be used to form a separate transistor in each of the two doped regions 202, 203. Additionally, first layer doped region contacts 206 are formed over the doped regions 202. These first layer doped region contacts are on the same circuit level as the gate lines. As mentioned above, the first layer doped region contacts 206 may be formed using a first layer mask.

FIG. 2B is a diagram showing the second layer of an illustrative circuit device 200. As illustrated, second layer doped contact regions 212, 214 are formed over the first layer doped contact regions to form full doped region contacts. Some of the second layer doped region contacts 212 match the underlying first layer doped region contacts 206. Some second layer doped region contacts 214, however, do not match the underlying first layer doped region contacts 206.

Specifically, the second layer doped region contact 214 is elongated in nature and also serves to form an electrical connection between two different doped regions 202. Such use of a contact makes efficient use of semiconductor space. Typical circuits often include connections between different source/drain regions of different switching devices such as transistors. For example, the source region of one transistor may be connected to the drain region of a different transistor. In some examples, the first layer contacts 206 may include the elongated portion to connect the two separate doped regions. This may be done for various mask optimization purposes as will be described in further detail below.

The second layer of the circuit device 200 also includes the gate contacts 210, 216. Some gate contacts 210 serve only as contacts, while other gate contacts 216 also serve as electrical connections. Specifically, the gate contact 216 connects two different gate lines 204. This may form, for example, a cross-coupled transmission gate. Specifically, two corresponding sets of transistors are cross-coupled together. In some cases (not illustrated), a gate contact may connect a gate device to a first layer doped region contact, thus creating an electrical connection between a gate device and its source or drain terminal.

Figure 2C:
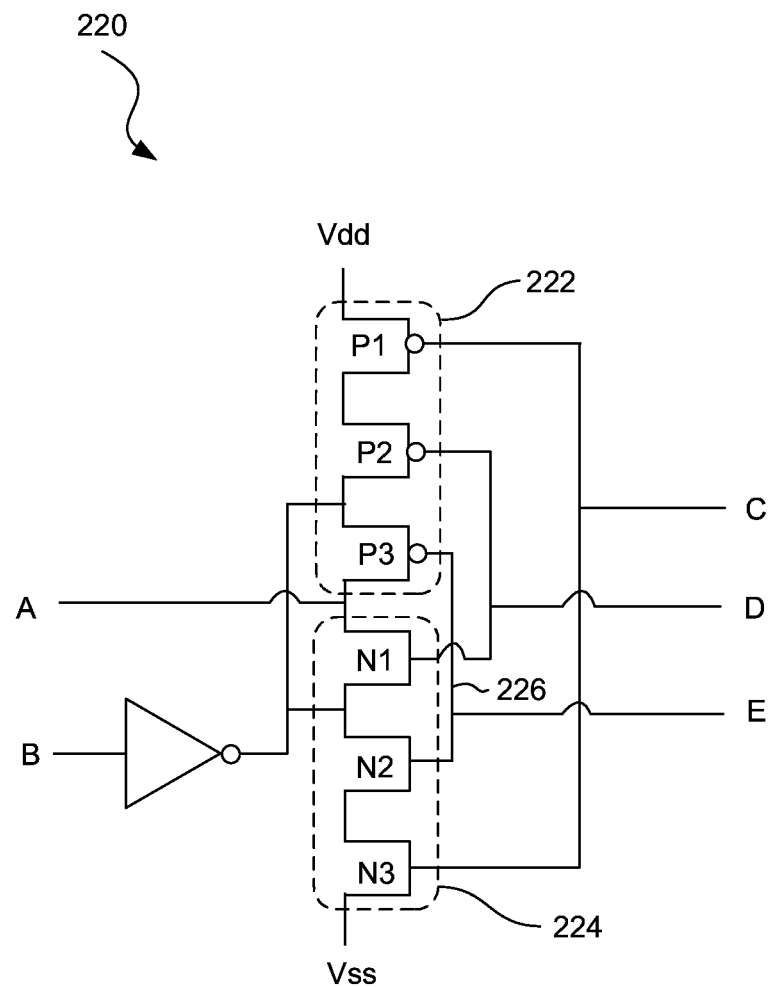
FIG. 2C is a diagram showing an illustrative circuit diagram of a device that can utilize mask optimization, according to one example of principles described herein.

FIG. 2C is a diagram showing an illustrative circuit schematic 220 of a device that can utilize mask optimization. The circuit schematic corresponds with the structure illustrated in FIGS. 2A and 2B. Such a structure forms a transmission gate.

The transmission gate includes a set 222 of p-type transistors and a set 224 of n-type transistors. The two sets of transistors are connected with the elongated portion of either the first layer contacts 206 or the second layer contacts 214. The connection 226 between P3 and N2 corresponds to the connection 216 between two gate lines as illustrated in FIG. 2B.

Typically, the connection 226 between the two gates is formed using the same mask as other contacts used to connect the gate structures to other features formed in other layers of a semiconductor device. In some cases, however, these gate contacts may be either too close to each other or too close to the connection contact 226 between the gate lines. Thus, it is important to optimize the mask assignment. As will be described in further detail below, some gate contact features may be moved to a different mask. The different mask is the one used to form second layer contacts.

Figure 3:
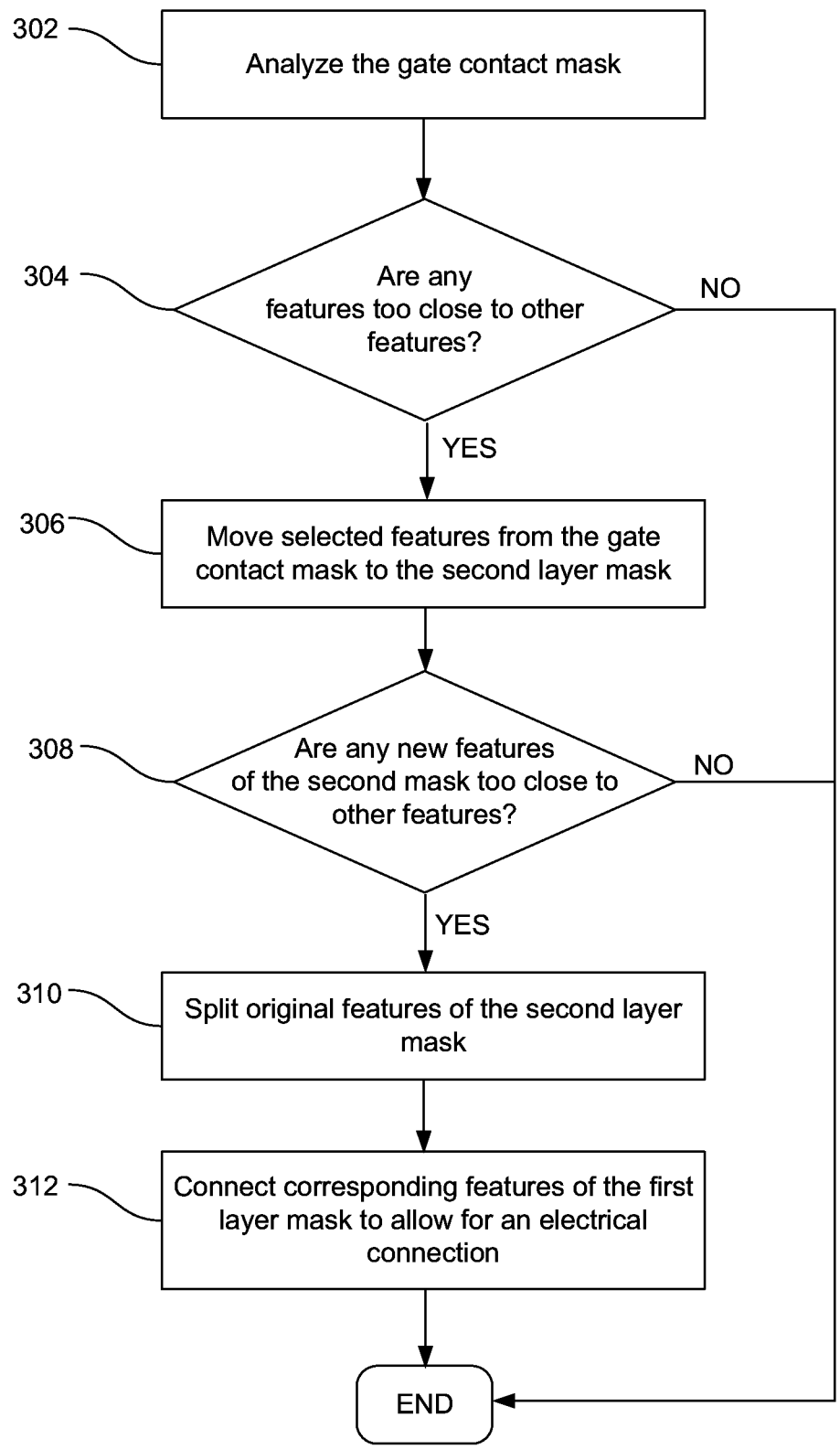
FIG. 3 is a flowchart showing an illustrative method for optimizing masks used to form multilayer doped region contacts and gate contacts, according to one example of principles described herein.

FIG. 3 is a flowchart showing an illustrative method for optimizing masks used to form multilayer doped region contacts and gate contacts. According to certain illustrative examples, the method begins by analyzing 302 the gate contact mask pattern to determine if any features should be moved to a different mask, specifically, the second layer mask. Two features on the same mask that are too close to each other can cause problems during the exposure process. For example, the distance between the two features might be beyond the resolution of the light source projected onto a photoresist layer through the mask. In some cases, features that are too close together may violate a minimum pitch of a critical dimension.

If it is determined in step 304 that no features are within a specified distance from each other, then the process finishes and no further changes are made. If, however, it is determined in step 304 that any features are too close to each other, then the process continues by moving 306 certain features from the gate contact mask to the second layer mask. The exact feature or features that are moved to the second layer mask can be determined through a variety of methods, as will be explained in further detail below.

After the selected features have been moved to the second layer mask pattern, it is then determined 308 if those new features on the second layer mask are too close to any of the original features of the second layer mask. If it is determined in step 308 that no new features are too close to any original features, then the process finishes and no further changes are made. If, however, it is determined in step 308 that some of the new features of the second layer mask are too close to any original features, then the process continues by splitting the original features of the second layer mask that are too close to the new features.

Such original features are those that serve as electrical connections as well as contacts. Thus, in order to maintain the electrical connection, the corresponding features of the first layer mask are connected 312 in order to allow for that electrical connection. Thus, the overall function of the circuit is not affected and the masks have been optimized such that features are not too close to one another. This process is particularly useful in cases where the circuit device includes many congested features. For example, it is desirable to form memory cells that are as small in size as possible. Through use of principles described herein, the process of forming smaller memory devices is facilitated.

Figure 4:
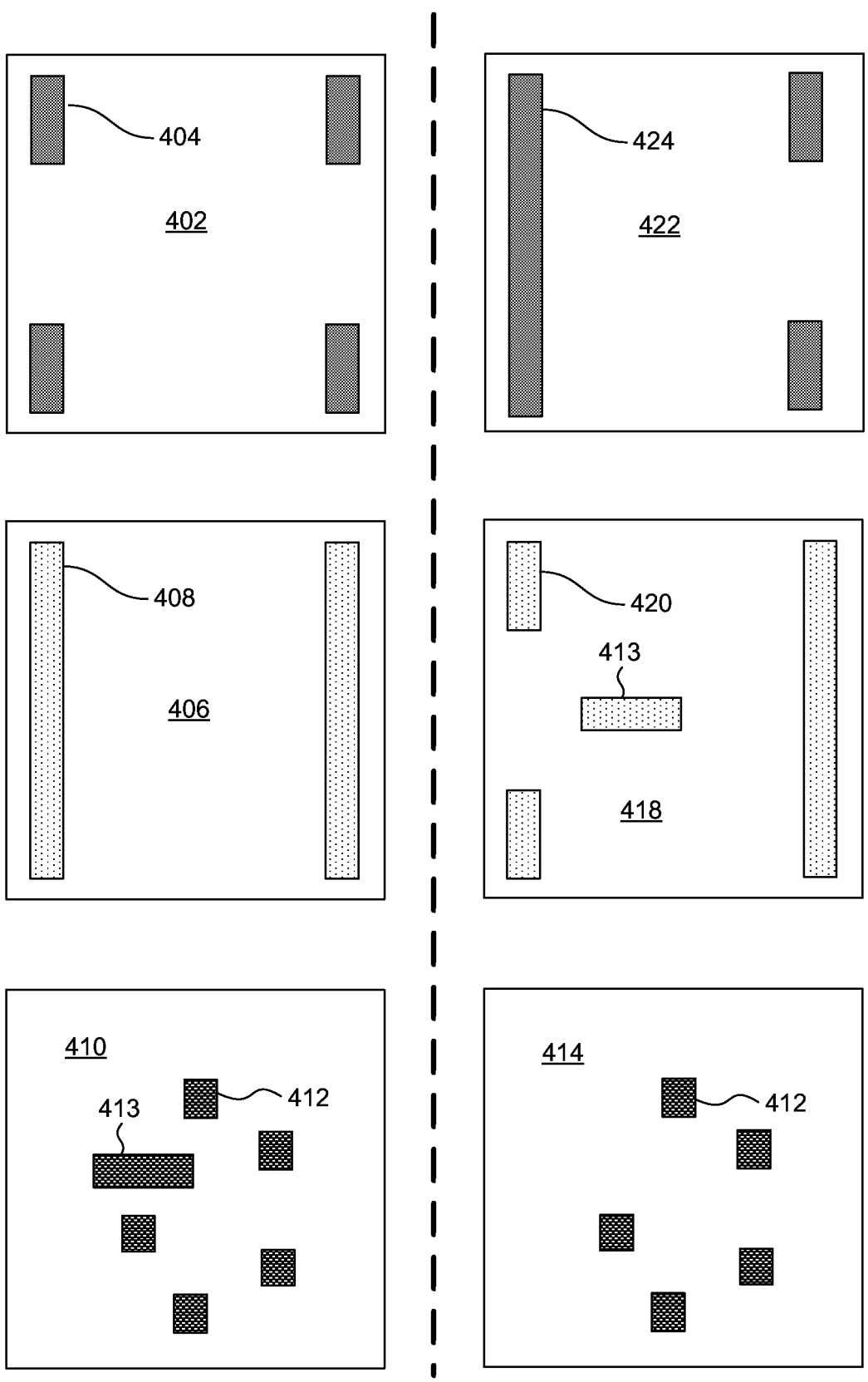
FIG. 4 is a diagram showing a set of masks before and after an optimization process, according to one example of principles described herein.

FIG. 4 is a diagram showing a set of masks before and after an optimization process. The left side of the dotted line illustrates the first layer mask 402, the second layer mask 406, and the gate contact mask 410 before optimization. The right side of the dotted line illustrates the first layer mask 422, the second layer mask 418, and the gate contact mask 414 after optimization.

According to the present example, the first layer mask 402 includes a number of features 404 used to form first layer doped region contacts 404. The second layer mask 406 includes a number of elongated features 408 that are used to form the second layer doped region contacts. The elongated features 408 also serve as electrical connections between two different doped regions.

The gate contact mask 410 includes a number of features 412, 413 that are used to form the gate contacts. In this example, the elongated feature 413, which is used to connect two gate devices together as well as serve as a gate contact, is too close to some other features 412. It may have been determined that this particular feature 413 is the preferred feature to move to the second layer mask 406.

After the optimization process, the revised gate contact mask 414 includes all of the features 412 except for the elongated feature 413. In this example, there are now no two features 412 that are too close to each other. The elongated feature 413 has been moved to the revised second layer mask 418. Because the elongated feature 413 was too close to one of the features 408 of the original second layer mask 406, that original feature was split. Thus, the revised second layer mask 418 includes the split feature 420.

With the split feature 420 no longer serving as an electrical connection between two doped regions, the corresponding feature 404 of the original first layer mask 402 is changed to form the appropriate electrical connection. Thus, the revised first layer mask 422 includes an elongated feature 424 that is used to form the electrical connection that was cut by the split in the revised second layer mask 418. The features can be moved from the gate contact mask to the second layer mask without adversely affecting the functionality of the circuit for which the masks are used to create.

Figure 5:
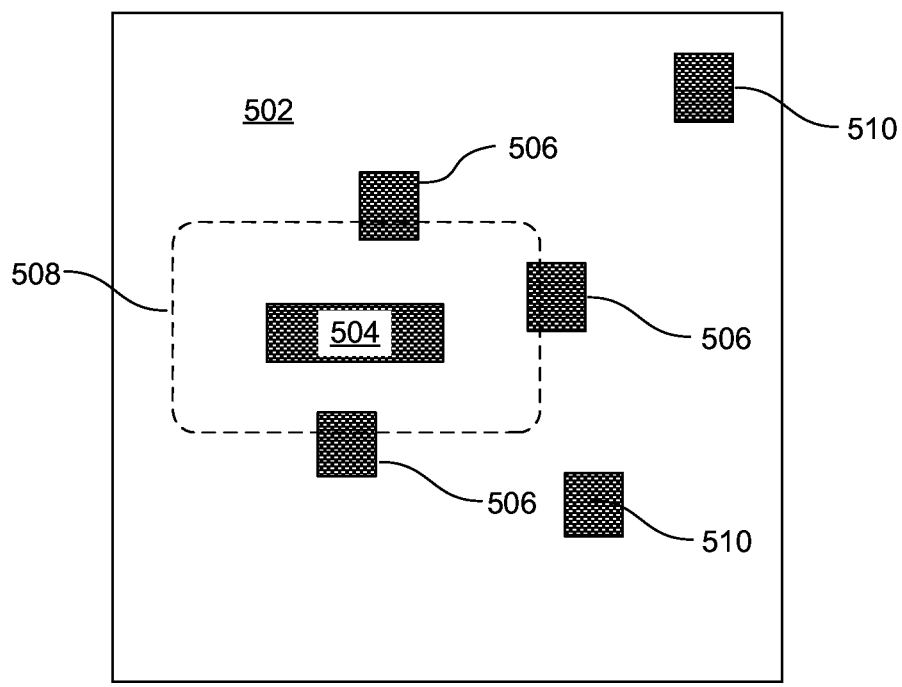
FIG. 5 is a diagram showing an illustrative spacing rule to be used with mask optimization, according to one example of principles described herein.

FIG. 5 is a diagram showing an illustrative spacing rule to be used with mask optimization. As mentioned above, a function may be applied to determine which features, if any, should be moved from the gate contact mask to the second layer mask. A feature may have to be moved from the gate contact mask to the second layer mask if that feature is in violation of a rule. For example, there may be a spacing rule that requires each feature to be at least a specific distance from any other feature. This specific distance may be based on a variety of factors including the nature of the photolithography tools that will be used with the mask.

FIG. 5 illustrates an example of a gate contact mask 502 having a number of features 504, 506, 510. The elongated feature 504 is the one that is determined to be moved to the second layer mask. In this example, the minimum distance is indicated by the dotted rectangle 508. The function that determines which features are too close to other features may also determine the optimal feature to be moved to the second layer mask. In general, it is desirable to move as few features as possible to the second layer mask. In this example, the elongated feature is close to three different other features 506. If one of the other features 506 were moved instead of the elongated feature, 504, then the remaining other features 506 would still be too close to the elongated feature 504. Thus, by moving the elongated feature 504, no other features remaining on the gate contact mask 502 are in violation of the spacing rule.

The spacing rule may vary depending on a variety of factors. In one example, the spacing rule may have a minimum distance within a range of about 60 nanometers to 70 nanometers. For example, the minimum distance may be 60, 65, or 70 nanometers. For other applications, other ranges of distances may be applicable.

Figure 6:
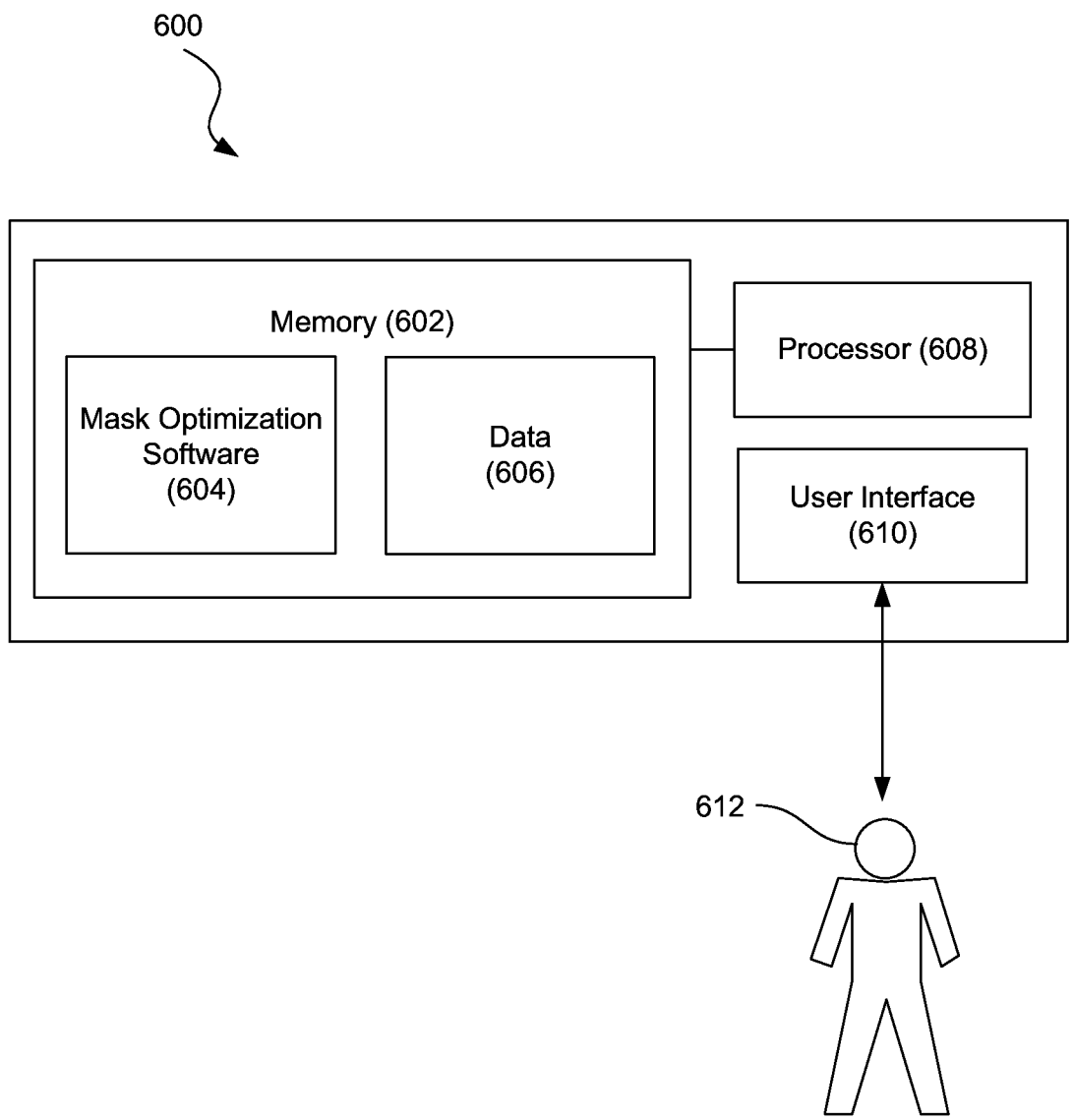
FIG. 6 is a diagram showing an illustrative computing system that can be used to perform mask optimization, according to one example of principles described herein.

FIG. 6 is a diagram showing an illustrative computing system that can be used to perform mask optimization. According to certain illustrative examples, the physical computing system 600 includes a memory 602 having modeling software 604 and data 606 stored thereon. The physical computing system 600 also includes a processor 608 and a user interface 610.

There are many types of memory available. Some types of memory, such as solid state drives, are designed for storage. These types of memory typically have large storage volume but relatively slow performance. Other types of memory, such as those used for Random Access Memory (RAM), are optimized for speed and are often referred to as "working memory." The various forms of memory may store information in the form of software 604 and data 606.

The physical computing system 600 also includes a processor 608 for executing the software 604 and using or updating the data 606 stored in memory 602. In addition to storing the mask optimization software 604, the memory 602 may store an operating system. An operating system allows other applications to interact properly with the hardware of the physical computing system 600.

The mask optimization software 604 may include the tools to analyze a gate contact mask and determine which features, if any should be moved to a second layer mask. Additionally, the mask optimization software 604 includes the tools to move, split, and connect features to optimize the feature layout across all masks while maintaining the desired circuit functionality.

A user interface 610 may provide a means for a user 612 to interact with the system. The user may use various tools such as a keyboard or a mouse to input information into the physical computing system. Additionally, various output devices such as a monitor may be used to provide information to the user 612.

Figure 7:
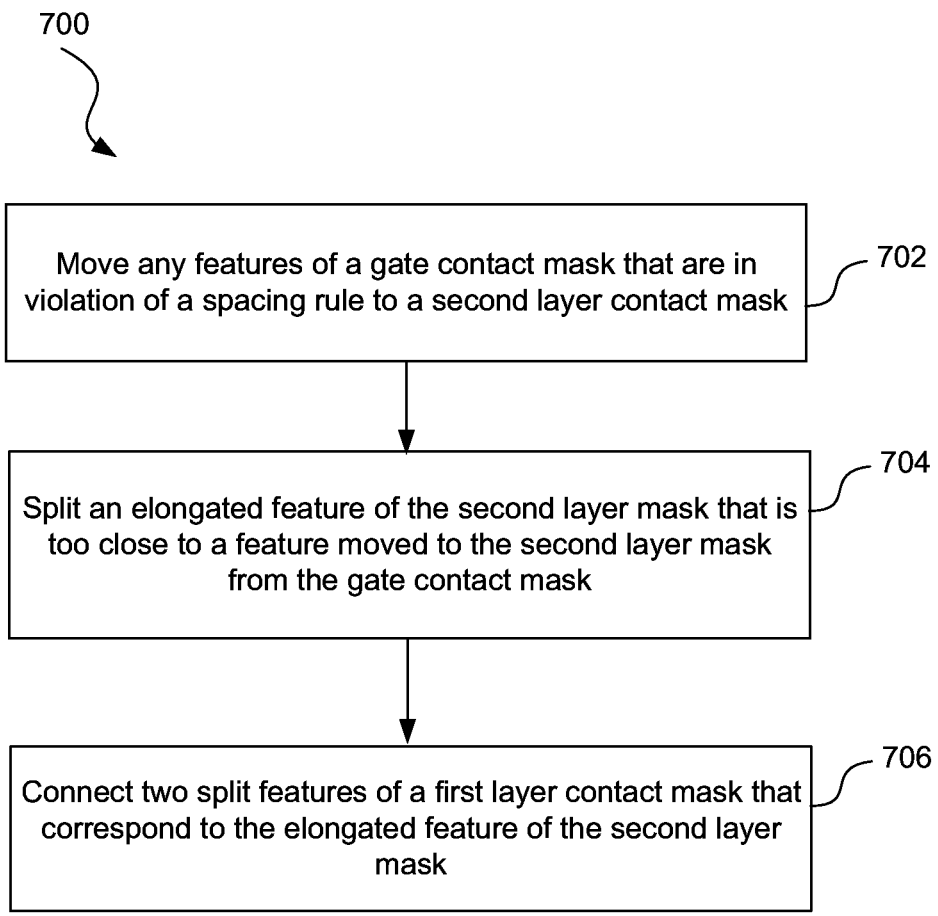
FIG. 7 is a flowchart showing an illustrative method for optimization of multilayer contact masks, according to one example of principles described herein.

FIG. 7 is a flowchart showing an illustrative method for optimization of multilayer contact masks. According to certain illustrative examples, the method includes a step 702 for moving any features of a gate contact mask that are in violation of a spacing rule to a second layer contact mask. The method further includes a step 704 for splitting an elongated feature of the second layer mask that is too close to a feature moved to the second layer mask from the gate contact mask. The method further includes a step 706 for connecting two split features of a first layer contact mask, the split features corresponding to the elongated feature of the second layer mask.

According to certain illustrative examples, a method for optimizing masks for multilayer contacts, the method including moving any features of a gate contact mask that are in violation of a spacing rule to a second layer contact mask, splitting an elongated feature of the second layer mask that is too close to a feature moved to the second layer mask from the gate contact mask, and connecting two split features of a first layer contact mask, the split features corresponding to the elongated feature of the second layer mask.

According to certain illustrative examples, a semiconductor device includes two elongated active regions that include source/drain regions for multiple transistor devices, a first contact layer that includes an electrical connection between the two active regions, a second contact layer that includes a connection between two gate lines, and a gate contact layer that provides connections to the gate lines.

According to certain illustrative examples, a circuit device includes a set of p-type transistors having source/drain regions formed into a first elongated active region, a set of n-type transistors having source/drain regions formed into a second elongated active region, a first layer including both gate lines for the transistors and contact features, a second layer including further contact features. A contact feature of the second layer provides a connection between two gate lines to form a cross-coupled transmission gate.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method for mask assignment optimization, the method comprising:
    moving a feature of a gate contact mask that is in violation of a spacing rule to a second layer contact mask;
    splitting an elongated feature of the second layer contact mask that is within a predefined distance from the feature moved to the second layer contact mask from the gate contact mask; and
    connecting two split features of a first layer contact mask, the split features corresponding to the elongated feature of the second layer contact mask.

2. The method of claim 1, further comprising, applying a function to determine which features of the gate contact mask are in violation of a spacing rule.

3. The method of claim 2, wherein the function is designed to select a fewest number of features.

4. The method of claim 1, wherein the spacing rule prevents features from being within a range of about 60-70 nanometers of other features.

5. The method of claim 1, wherein connecting the two split features is such that an electrical connection is made between features formed with the first layer contact mask.

6. The method of claim 1, wherein the masks are used to form features within a memory cell.

7. The method of claim 6, further comprising, using the first layer contact mask to form first layer contact features into a first interlayer dielectric layer.

8. The method of claim 7, further comprising, using the second layer contact mask to form second layer contact features that connect to first layer contact features through a second dielectric layer.

9. The method of claim 8, further comprising, using the gate contact layer to form gate contacts into the second dielectric layer to gate devices surrounded by the first dielectric layer.

10. A method comprising:
    receiving a first set of features corresponding to gate contacts, a second set of features corresponding to contacts to be formed on a substrate, and a third set of features corresponding to contacts to be formed on the contacts of the second set of features;
    identifying a first feature of the first set of features that violates a design rule; and
    based on the first feature violating the design rule, moving the first feature from the first set of features to the third set of features;
    thereafter, providing the first set of features, the second set of features, and the third set of features for use in forming a mask set for integrated circuit fabrication.

11. The method of claim 10 further comprising:
    identifying a second feature of the third set of features spaced less than a minimum distance from the first feature; and
    based on the second feature being spaced less than the minimum distance from the first feature, moving at least a portion of the second feature to the second set of features prior to the providing of the first set of features, the second set of features, and the third set of features for use in forming the mask set.

12. The method of claim 10,
    wherein the second feature electrically couples an active region of a transistor of a first type to an active region of a transistor of a second type, and
    wherein the first type and the second type are different.

13. The method of claim 10 further comprising:
    identifying a second feature of the third set of features spaced less than a minimum distance from the first feature; and
    based on the second feature being spaced less than the minimum distance from the first feature:
        splitting the second feature into a plurality of parts; and
        connecting the plurality of parts using one or more features of the second set of features.

14. The method of claim 10 further comprising determining a minimum number of features of the first set of features to move to the third set of features in order to satisfy the design rule,
    wherein the moving of the first feature from the first set of features to the third set of features is further based on the first feature being one of the minimum number of features.

15. The method of claim 10 wherein the first set of features, the second set of features, and the third set of features correspond to a memory cell.

16. A method comprising:
receiving a group of gate contact features, a group of lower substrate contact features, and a group of upper substrate contact features;
determining that a first feature of the group of gate contact features is spaced closer than a first minimum distance from a second feature of the group of gate contact features;
based on the determination, moving the first feature from the group of gate contact features to the group of upper substrate contact features;
determining whether the first feature violates a design rule with respect to the group of upper substrate contact features; and
after moving the first feature to the group of upper substrate contact features, providing the group of gate contact features, the group of lower substrate contact features, and the group of upper substrate contact features for use in fabricating an integrated circuit.

17. The method of claim 16 further comprising:
based on determining that a third feature of the group of upper substrate contact features is spaced closer than a second minimum distance from the first feature, moving at least a portion of the third feature to the group of lower substrate contact features.

18. The method of claim 16 further comprising:
based on determining that a third feature of the group of upper substrate contact features is spaced closer than a second minimum distance from the first feature:
separating the third feature into a plurality of segments, and
electrically coupling the plurality of segments by adding at least one feature to the group of lower substrate contact features.

19. The method of claim 16 wherein the group of gate contact features, the group of lower substrate contact features, and the group of upper substrate contact features correspond to a memory cell.

20. The method of claim 16 further comprising determining a minimum number of features of the group of gate contact features to move to the group of upper substrate contact features in order to satisfy a design rule.

* * * * *